(12) United States Patent
Horak et al.

(10) Patent No.: US 8,030,202 B1
(45) Date of Patent: Oct. 4, 2011

(54) TEMPORARY ETCHABLE LINER FOR FORMING AIR GAP

(75) Inventors: David V. Horak, Essex Junction, VT (US); Elbert E. Huang, Carmel, NY (US); Charles W. Koburger, III, Delmar, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/964,831

(22) Filed: Dec. 10, 2010

(51) Int. Cl.
*H01L 21/4763* (2006.01)
*H01L 21/44* (2006.01)

(52) U.S. Cl. .................. 438/619; 438/639; 438/675

(58) Field of Classification Search .......... 438/619, 438/639, 675; 257/E21.581
See application file for complete search history.

(56) References Cited

U.S. PATENT DOCUMENTS

| | | | |
|---|---|---|---|
| 5,324,683 A | 6/1994 | Fitch et al. | |
| 6,228,763 B1 | 5/2001 | Lee | |
| 6,342,722 B1 | 1/2002 | Armacost et al. | |
| 6,492,245 B1 | 12/2002 | Liu et al. | |
| 6,548,362 B1 | 4/2003 | Wu | |
| 6,737,725 B2 | 5/2004 | Grill et al. | |
| 6,913,946 B2 | 7/2005 | Lin | |
| 7,088,003 B2 | 8/2006 | Gates et al. | |
| 7,094,669 B2 | 8/2006 | Bu et al. | |
| 7,385,266 B2 * | 6/2008 | Segal et al. | 257/414 |
| 7,534,696 B2 | 5/2009 | Jahnes et al. | |
| 7,671,442 B2 | 3/2010 | Anderson et al. | |
| 7,906,439 B2 * | 3/2011 | Perruchot et al. | 438/752 |
| 2009/0072409 A1 | 3/2009 | Nitta et al. | |
| 2009/0309230 A1 | 12/2009 | Cui et al. | |

* cited by examiner

*Primary Examiner* — William M. Brewster
(74) *Attorney, Agent, or Firm* — Gibb I.P. Law Firm, LLC; Anthony Canale

(57) ABSTRACT

An exemplary method lines the sidewalls of a first opening with a sacrificial material and then fills the first opening with a metallic conductor in a manner such that the metallic conductor contacts the substrate. Next, the method selectively removes the sacrificial material, to create at least one "second" opening along the metallic conductor within the first opening. The method selectively removes portions of the first insulator layer through the second opening to leave at least one air gap between the metallic conductor and the first insulator layer in the lower region of the second opening.

20 Claims, 5 Drawing Sheets

TEMPORARY ETCHABLE LINER FOR FORMING AIR GAP

BACKGROUND

The present invention relates to forming electrical contacts within integrated circuit structures, and more specifically to forming conductive contacts through inter-dielectric layers and including air gaps next to the conductive contacts.

Gate-to-contact parasitic capacitances in integrated circuit (IC) structures contribute to increased power consumption and reduced device performance/speed. Typical spacers formed on gate sidewalls employ silicon nitride, but silicon nitride has a relatively high dielectric constant and thus results in high gate parasitic capacitances. Oxide spacers can reduce capacitance but do not stand up well to typical processing such as silicide (HF) precleans. Nitride spacers can also be used, and later removed following silicide formation, and replaced with lower-capacitance materials (oxide, or low-K materials).

SUMMARY

An exemplary method embodiment herein forms a first insulator layer on a substrate having polysilicon conductor structures and forms a dielectric cap layer (different than the first insulator layer) on the first insulator layer. The method then patterns at least one "first" opening through the first insulator layer and the dielectric cap layer to expose the substrate. When patterning the first opening, the method can form a tapered first opening that is wider through the dielectric cap layer relative to the first insulator layer.

The method lines the sidewalls of the first opening with a sacrificial material and fills the first opening with a metallic conductor in a manner such that the metallic conductor contacts the substrate. When lining the sidewalls of the first opening with the sacrificial material, the method can first form a preliminary sacrificial material along the dielectric cap layer within the tapered first opening before lining the sidewalls of the first opening with the sacrificial material. In such a situation, the sacrificial material is positioned along the full length of the first opening and the preliminary sacrificial material is positioned only along the upper portion of the first opening.

Next, the method selectively removes the sacrificial material, to create at least one "second" opening along the metallic conductor within the first opening. The second opening runs between the metallic conductor and the first insulator layer, and between the metallic conductor and the dielectric cap layer. The method then selectively removes portions of the first insulator layer through the second opening in a process that removes the first insulator layer at a faster rate than the dielectric cap layer is removed. This makes the second opening wider in a lower region between the metallic conductor and the first insulator layer relative to an upper region between the metallic conductor and the dielectric cap layer.

Following that, the method deposits a conformal (or a non-conformal) insulator material into the upper region of the second opening to fill the upper region of the second opening, thereby sealing off the second openings, and to leave at least one air gap between the metallic conductor and the first insulator layer in the lower region of the second opening. If a conformal insulator is used, the conformal insulator lines the lower region of the second opening. The air gap thus formed insulates the metallic conductor from the first insulator layer and from the polysilicon conductors. Following this, the method then forms a conductive layer on the dielectric cap layer. This metallic conductor electrically connects the substrate and the conductive layer.

DETAILED DESCRIPTION

In view of the foregoing issues, the embodiments herein form air gaps that are self-aligned to conductive contacts within inter-dielectric layers by using temporary/disposable spacers into the material stacks lining the contact holes. After the contact is filled or plated and chemical-mechanical polishing (CMP) is performed, the temporary/disposable spacers are removed (selective to the contact metallization layers and plugs) and an etchant (e.g., HF, etc.) is introduced through the areas where the disposable spacers were located to remove portions of the inter-dielectrics layer (oxide or lo-K) thereby turning those areas into air-gaps. The "air" in the air gaps can comprise any desired ambient gas combination, such as oxygen, hydrogen, nitrogen, helium, etc., that is present while the air gaps are being sealed.

By forming temporary/disposable spacers with appropriate film non-conformality, the taper at the top of the gaps is tailored so that the air gap tops can be filled with dielectric materials which will then prevent air-gap penetration during processing of subsequent layers. Further, by utilizing sacrificial spacers to determine where the air gaps will be located, it is not necessary to perform additional processing steps to pattern initial air gap openings such as is done in U.S. Pat. No. 7,671,442, the complete disclosure of which is incorporated herein by reference (and the embodiments herein avoid any potential improper opening alignment such patterning may cause). Also, the air gaps can be formed immediately adjacent to the conductors because the sacrificial sidewall spacers can be formed directly adjacent and contacting the conductors.

Figure 1:
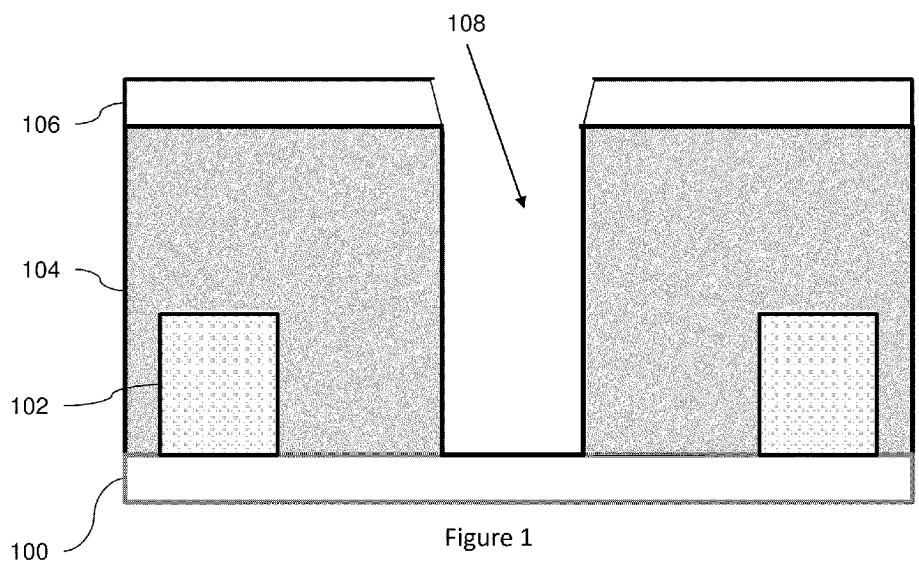
FIG. 1 is a schematic cross-sectional diagram illustrating an exemplary structure according to embodiments herein.

As shown in cross-sectional view in FIG. 1, an exemplary method embodiment herein forms a first insulator layer 104 on a substrate 100 having transistors with polysilicon conductor structures 102 and forms a dielectric cap layer 106 (different than the first insulator layer 104) on the first insulator layer 104.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate dielectric materials, including but not limited to silicon dioxide, silicon nitride, silicon oxynitride, a gate dielectric stack of SiO2 and Si3N4, and metal oxides like tantalum oxide. Alternatively, the dielectrics herein may be formed from any of the many candidate low dielectric constant (low-K) materials, including but not limited to carbon-doped-oxide (CDO). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as copper, tungsten, hafnium, tantalum, molybdenum, titanium, or nickel, or a metal silicide, any alloys of such metals, and may be deposited using physical vapor deposition, chemical vapor deposition, or any other technique known in the art.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate dielectric" (which is an insulator) and current/voltage within the gate changes the conductivity of the channel region of the transistor.

The method then patterns at least one "first" opening through the first insulator layer 104 and the dielectric cap layer 106 to expose the substrate 100. When patterning the first opening 108, the method can form a tapered first opening 108 that is wider through the dielectric cap layer 106 relative to the first insulator layer 104.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Figure 2:
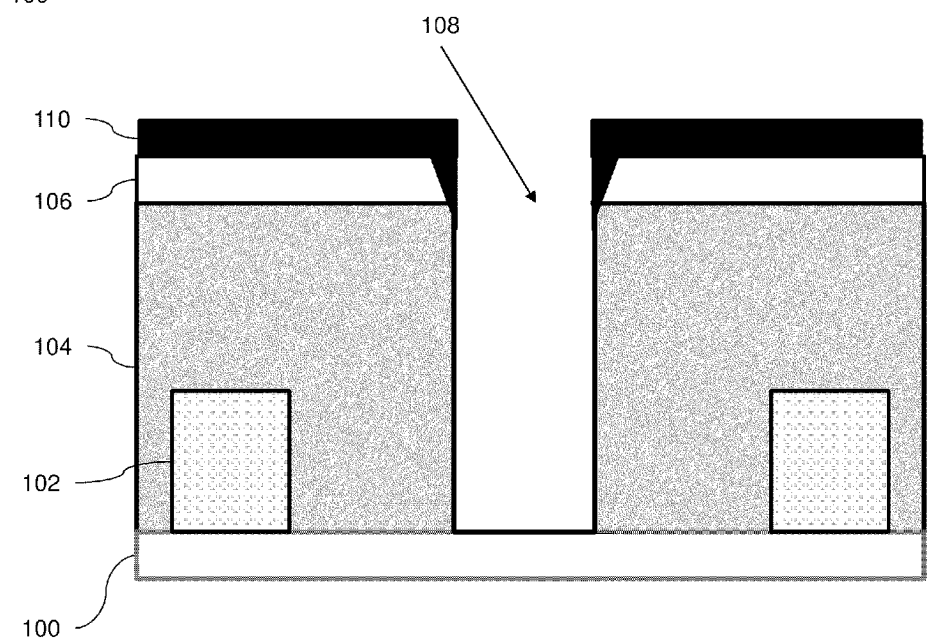
FIG. 2 is a schematic cross-sectional diagram illustrating an exemplary structure according to embodiments herein.
Figure 3:
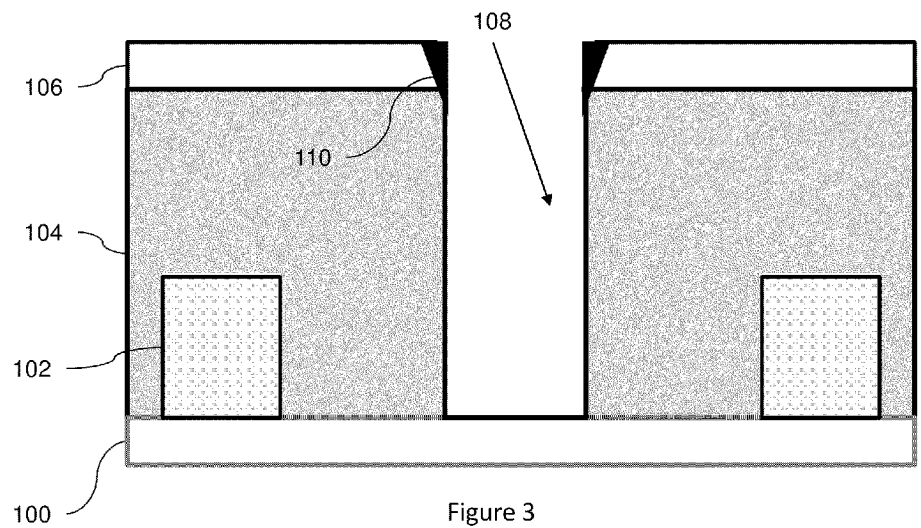
FIG. 3 is a schematic cross-sectional diagram illustrating an exemplary structure according to embodiments herein.
Figure 4:
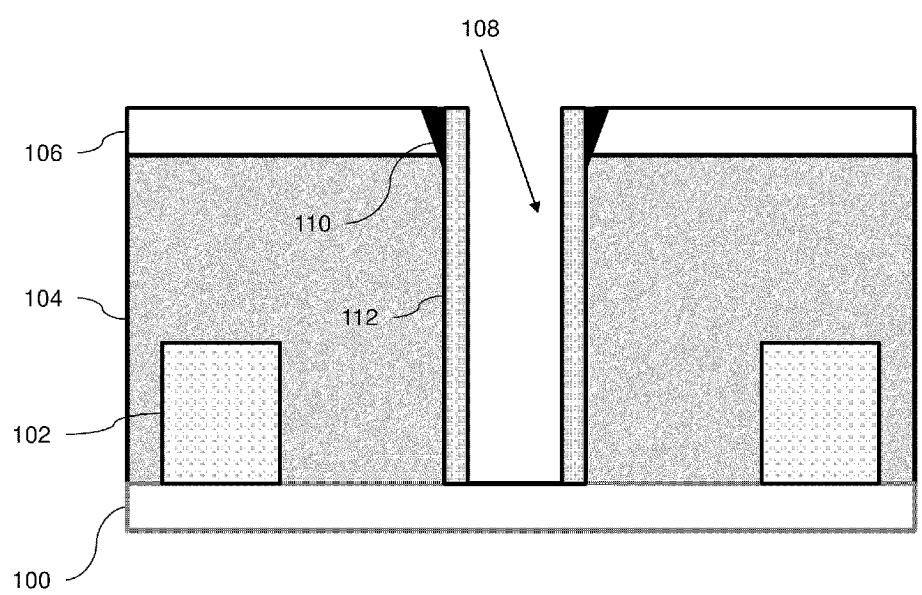
FIG. 4 is a schematic cross-sectional diagram illustrating an exemplary structure according to embodiments herein.

The method optionally lines the sidewalls of the first opening 108 with a preliminary sacrificial material 110 that can be non-conformal (such as silicon dioxide, amorphous carbon, etc.). More specifically, as shown in FIG. 2, the preliminary sacrificial material 110 is deposited on the cap layer 106, and potentially on the sidewalls of the first opening 108, depending on conformality and aspect ratio of the first opening 108. Then, as shown in FIG. 3, the preliminary sacrificial material 110 is removed from the horizontal surfaces to leave the preliminary sacrificial material 110 in the upper portion of the first opening 108. Next, as shown in FIG. 4, the embodiments herein line the sidewalls of the first opening 108 with the main sacrificial material 112 (such as silicon dioxide, amorphous carbon, etc.) that can be conformal (substantially (e.g., 20%, 40%, 60%, etc.) more conformal than the non-conformal preliminary sacrificial material 110). If the preliminary sacrificial material 110 is utilized, the main sacrificial material 112 is positioned along the full length of the first opening 108 and the preliminary sacrificial material 110 is positioned only along the upper portion of the first opening 108 (in the region of the cap layer 106).

For purposes herein, layers that line the sidewall of a structure are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers or sidewall layers.

Figure 5:
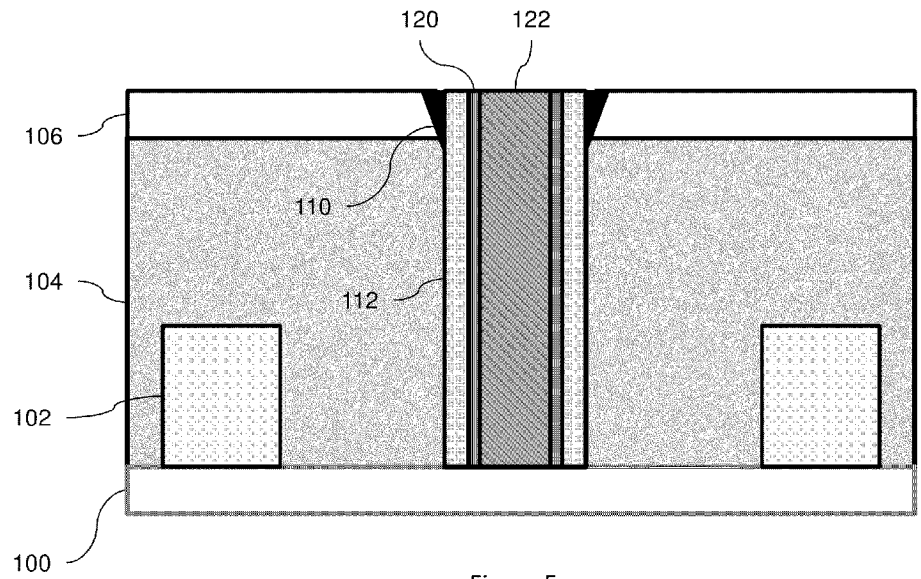
FIG. 5 is a schematic cross-sectional diagram illustrating an exemplary structure according to embodiments herein.

Next, as shown in FIG. 5, the method fills the remainder of the first opening 108 with a metallic conductor 122 (and an optional liner layer 120 (e.g., Ta/TaN, Ru, etc.)) in a manner such that the metallic conductor/liner 120/122 contacts the substrate 100. Various processes, such as CMP can be performed to place the structure in the state shown in FIG. 5.

Figure 6:
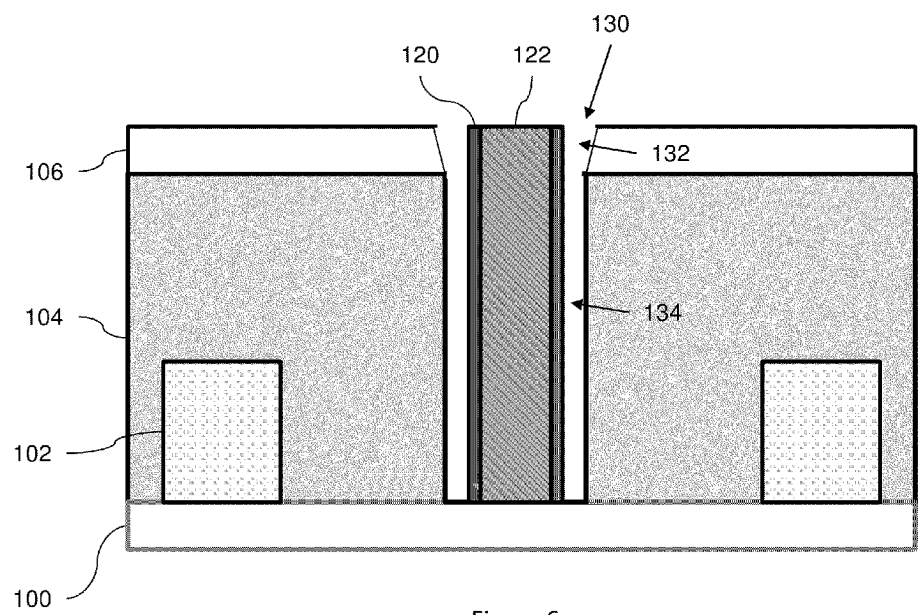
FIG. 6 is a schematic cross-sectional diagram illustrating an exemplary structure according to embodiments herein.

Next, as shown in FIG. 6, the method embodiments herein selectively remove the sacrificial material 112, to create at least one "second" opening 130 running along the metallic conductor 120/122 within the first opening 108. The second opening 130 runs between the metallic conductor 120/122 and the first insulator layer 104, and between the metallic conductor 120/122 and the dielectric cap layer 106.

All material removal processes herein can comprise etching, chemical immersion, chemical rinsing, etc., and a selective material removal process is a process that (through proper chemical selection of the removal agents that dissolve the sacrificial material 110/112) removes the sacrificial material 110/112 at a faster rate than the inter-dielectric insulator layer 104, the dielectric cap layer 106, and the conductor 120/122 are removed. The materials selected for the removal agent, sacrificial material 112, the inter-dielectric insulator layer 104, the dielectric cap layer 106, and the conductor 120/122 can vary (depending upon the designer's specific goals); however, the removal agent should be "selective" and be able to remove the sacrificial material 110/112, without substantially affecting the surrounding structures.

Figure 7:
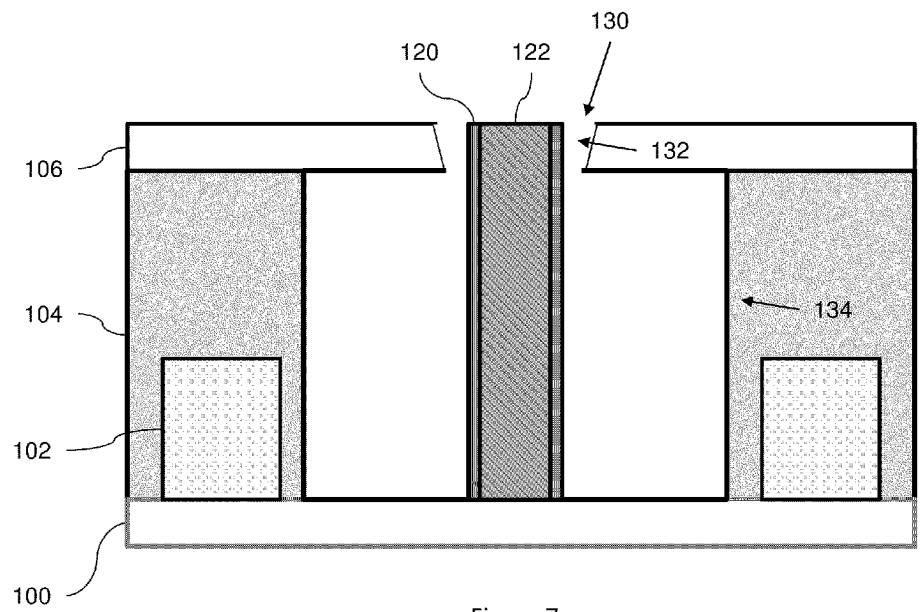
FIG. 7 is a schematic cross-sectional diagram illustrating an exemplary structure according to embodiments herein.

The method performs another similar selective removal process to remove portions of the first insulator layer 104 through the second opening 130 in a process that removes the first insulator layer 104 at a faster rate than the dielectric cap layer 106 is removed. As shown in FIG. 7, this makes the second opening 130 wider in a lower region 134 between the metallic conductor 122 and the first insulator layer 104 relative to an upper region 132 between the metallic conductor 122 and the dielectric cap layer 106. Once again, the materials selected for the removal agent, the inter-dielectric insulator layer 104, the dielectric cap layer 106, and the conductor 120/122 can vary (depending upon the designer's specific goals); however, the removal agent should be "selective" and be able to remove the inter-dielectric layer 104, without substantially affecting the surrounding structures.

Figure 8:
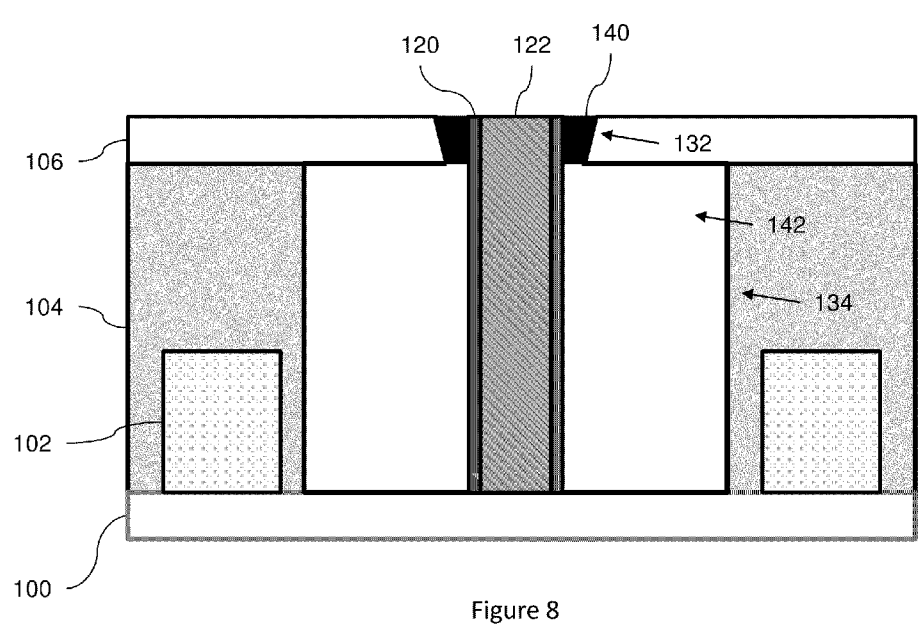
FIG. 8 is a schematic cross-sectional diagram illustrating an exemplary structure according to embodiments herein.
Figure 9:
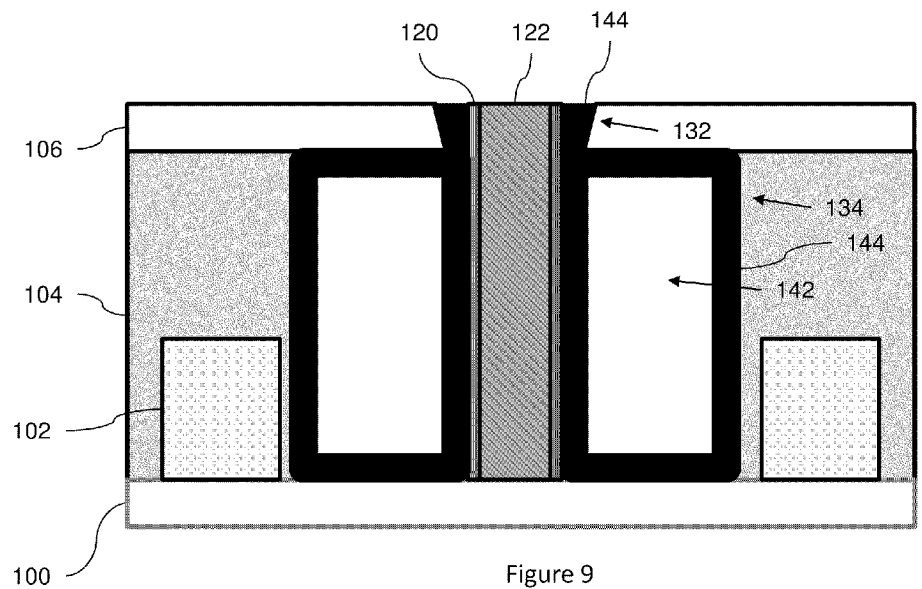
FIG. 9 is a schematic cross-sectional diagram illustrating an exemplary structure according to embodiments herein.
Figure 10:
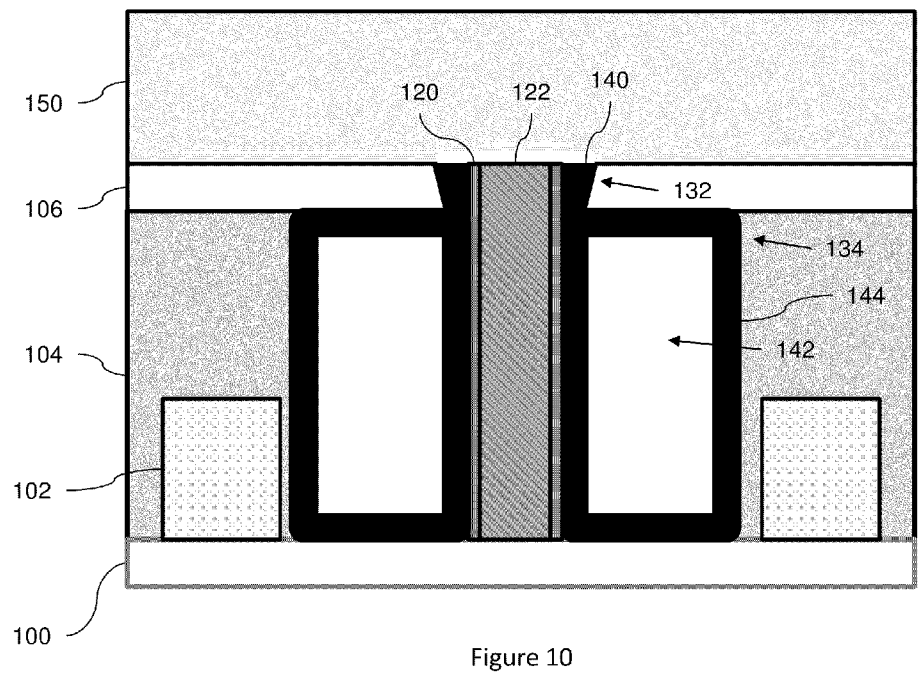
FIG. 10 is a schematic cross-sectional diagram illustrating an exemplary structure according to embodiments herein.

Following that, the method deposits a conformal (or a non-conformal) insulator material into the upper region 132 of the second opening 130 to fill the upper region 132 of the second opening 130, thereby sealing off the second opening 130, and to leave at least one air gap 142 between the metallic conductor 122 and the first insulator layer 104 in the lower region 134 of the second opening 130. The non-conformal insulator 140 is shown in FIG. 8, and the conformal insulator 144 is shown in FIGS. 9 and 10. If the conformal insulator 144 is used, the conformal insulator lines the lower region 134 of the second opening 130 (while the non-conformal insulator 140 would only extend into the upper region 132).

As shown in FIGS. 8-10, the first opening 108 formed in FIG. 1 is tapered (wider at the top than at the bottom). As shown in FIG. 5, the thickness of the combination of the preliminary sacrificial material 110 and the primary sacrificial material 112 fills the tapered opening 108 to allow the conductor 120/122 to be substantially linear (and non-tapered). Thus, as shown in FIG. 6, the upper portion 132 of the second opening 130 is tapered relative to the linear surface of the conductor 120/122. Therefore, as shown in FIGS. 8-10, the conformal (or nonconforming) insulator materials 140/144 creates a plug within the upper portion 132 that is firmly held in place by the tapered shape of the upper portion 132. To the contrary, a more linear (less tapered) opening would not hold the plug 140/144 in place as well. Because the plug 140/144 is held firmly in place, the subsequent processing performed will not breach the air gap 142 that is formed by the embodiments herein. Also, by utilizing sacrificial spacers to determine where the air gaps will be located, it is not necessary to perform additional processing steps to pattern initial air gap openings (and the embodiments herein avoid any potential improper opening alignment such patterning may cause). Also, the air gaps can be formed immediately adjacent to the conductors because the sacrificial sidewall spacers can be formed directly adjacent and contacting the conductors, thereby allowing greater electrical insulation.

The air gap 142 thus formed insulates the metallic conductor 122 from the first insulator layer 104 and from the polysilicon conductors 102. Following this, the method then forms a conductive layer 150 on the dielectric cap layer 106, as shown in FIG. 10. The metallic conductor 122 electrically connects the substrate 100 and the conductive layer 150.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    forming a first insulator layer on a substrate;
    forming a second insulator layer different than said first insulator layer on said first insulator layer;
    patterning at least one first opening through said first insulator layer and said second insulator layer to expose said substrate;
    lining sidewalls of said first opening with a sacrificial material;
    filling said first opening with a conductor, said conductor contacting said substrate;
    selectively removing said sacrificial material, to create at least one second opening along said conductor within said first opening, said second opening running between said conductor and said first insulator layer, and between said conductor and said second insulator layer;
    selectively removing portions of said first insulator layer through said second opening in a process that removes said first insulator layer at a faster rate than said second insulator layer is removed, making said second opening wider in a lower region between said conductor and said first insulator layer relative to an upper region between said conductor and said second insulator layer; and
    depositing a third insulator material into said upper region of said second opening to fill said upper region of said second opening and to leave at least one air gap between said conductor and said first insulator layer in said lower region of said second opening.

2. The method according to claim 1, said patterning of said first opening forming a tapered first opening that is wider through said second insulator layer relative to said first insulator layer.

3. The method according to claim 2, said lining of said sidewalls of said first opening with said sacrificial material comprising forming a preliminary sacrificial material along said second insulator layer within said tapered first opening before lining said sidewalls of said first opening with said sacrificial material.

4. The method according to claim 3, said sacrificial material being positioned along a full length of said first opening and said preliminary sacrificial material being positioned only along an upper portion of said first opening.

5. The method according to claim 1, said air gap insulating said conductor from said first insulator layer and from other adjacent conductive structures.

6. The method according to claim 1, further comprising forming a conductive layer on said second insulator layer, said conductor electrically connecting said substrate and said conductive layer.

7. The method according to claim 1, said filling of said first opening with said conductor comprising lining sidewalls of said sacrificial material with a first conductor and filling remaining portions of said first opening with said conductor.

8. A method comprising:
forming a first insulator layer on a substrate;
forming a second insulator layer different than said first insulator layer on said first insulator layer;
patterning at least one first opening through said first insulator layer and said second insulator layer to expose said substrate;
lining sidewalls of said first opening with a sacrificial material;
filling said first opening with a conductor, said conductor contacting said substrate;
selectively removing said sacrificial material, to create at least one second opening along said conductor within said first opening, said second opening running between said conductor and said first insulator layer, and between said conductor and said second insulator layer;
selectively removing portions of said first insulator layer through said second opening in a process that removes said first insulator layer at a faster rate than said second insulator layer is removed, making said second opening wider in a lower region between said conductor and said first insulator layer relative to an upper region between said conductor and said second insulator layer; and
depositing a third insulator material into said upper region of said second opening to fill said upper region of said second opening and to leave at least one air gap between said conductor and said first insulator layer in said lower region of said second opening,
said third insulator comprising a conformal insulator and said conformal insulator lining said lower region of said second opening.

9. The method according to claim 8, said patterning of said first opening forming a tapered first opening that is wider through said second insulator layer relative to said first insulator layer.

10. The method according to claim 9, said lining of said sidewalls of said first opening with said sacrificial material comprising forming a preliminary sacrificial material along said second insulator layer within said tapered first opening before lining said sidewalls of said first opening with said sacrificial material.

11. The method according to claim 10, said sacrificial material being positioned along a full length of said first opening and said preliminary sacrificial material being positioned only along an upper portion of said first opening.

12. The method according to claim 8, said air gap insulating said conductor from said first insulator layer.

13. The method according to claim 8, further comprising forming a conductive layer on said second insulator layer, said conductor electrically connecting said substrate and said conductive layer.

14. The method according to claim 8, said filling of said first opening with said conductor comprising lining sidewalls of said sacrificial material with a first conductor and filling remaining portions of said first opening with said conductor.

15. A method comprising:
forming a first insulator layer on a substrate having conductor structures;
forming a dielectric cap layer different than said first insulator layer on said first insulator layer;
patterning at least one first opening through said first insulator layer and said dielectric cap layer to expose said substrate;
lining sidewalls of said first opening with a sacrificial material;
filling said first opening with a metallic conductor, said metallic conductor contacting said substrate;
selectively removing said sacrificial material, to create at least one second opening along said metallic conductor within said first opening, said second opening running between said metallic conductor and said first insulator layer, and between said metallic conductor and said dielectric cap layer;
selectively removing portions of said first insulator layer through said second opening in a process that removes said first insulator layer at a faster rate than said dielectric cap layer is removed, making said second opening wider in a lower region between said metallic conductor and said first insulator layer relative to an upper region between said metallic conductor and said dielectric cap layer; and
depositing a conformal insulator material into said upper region of said second opening to fill said upper region of said second opening and to leave at least one air gap between said metallic conductor and said first insulator layer in said lower region of said second opening,
said conformal insulator lining said lower region of said second opening, and
said air gap insulating said metallic conductor from said conductor structures.

16. The method according to claim 15, said patterning of said first opening forming a tapered first opening that is wider through said dielectric cap layer relative to said first insulator layer.

17. The method according to claim 16, said lining of said sidewalls of said first opening with said sacrificial material comprising forming a preliminary sacrificial material along said dielectric cap layer within said tapered first opening before lining said sidewalls of said first opening with said sacrificial material.

18. The method according to claim 17, said sacrificial material being positioned along a full length of said first opening and said preliminary sacrificial material being positioned only along an upper portion of said first opening.

19. The method according to claim 15, said air gap insulating said metallic conductor from said first insulator layer.

20. The method according to claim 15, further comprising forming a conductive layer on said dielectric cap layer, said metallic conductor electrically connecting said substrate and said conductive layer.

* * * * *